US010250194B2

(12) United States Patent
Pratt et al.

(10) Patent No.: US 10,250,194 B2
(45) Date of Patent: Apr. 2, 2019

(54) BROADBAND ENVELOPE TRACKING

(71) Applicant: Analog Devices Global, Hamilton (BM)

(72) Inventors: Patrick Pratt, Mallow (IE); Joseph Bradford Brannon, Greensboro, NC (US); Ronald Dale Turner, Greensboro, NC (US)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/085,477

(22) Filed: Mar. 30, 2016

(65) Prior Publication Data
US 2017/0141736 A1   May 18, 2017

Related U.S. Application Data

(60) Provisional application No. 62/255,328, filed on Nov. 13, 2015.

(51) Int. Cl.
*H03F 3/04* (2006.01)
*H03F 1/02* (2006.01)
(Continued)

(52) U.S. Cl.
CPC ......... *H03F 1/0222* (2013.01); *H03F 1/3247* (2013.01); *H03F 3/19* (2013.01);
(Continued)

(58) Field of Classification Search
CPC . H03F 3/19; H03F 1/0222; H03F 3/21; H03F 1/3247; H03F 3/245; H03K 5/15046; H04B 1/0475
(Continued)

(56) References Cited

U.S. PATENT DOCUMENTS 7,026,868 B2 * 4/2006 Robinson .............. H03F 1/0227
330/10
8,183,917 B2 5/2012 Drogi et al.
(Continued)

FOREIGN PATENT DOCUMENTS

EP   2365628 A1   9/2011
EP   2432120 A1   3/2012

OTHER PUBLICATIONS

Chan, K., "GC5325 Envelope Tracking", Texas Instruments, Application Report SLWA058, (2010), 12 pgs.
(Continued)

*Primary Examiner* — Khanh V Nguyen
*Assistant Examiner* — Khiem Nguyen
(74) *Attorney, Agent, or Firm* — Schwegman Lundberg & Woessner, P.A.

(57) ABSTRACT

An envelope tracking scheme can be used, such as to modulate a supply node of a power amplifier circuit to improve efficiency. For example, a magnitude or amplitude envelope of a signal to be modulated can be scaled and used to drive a node, such as a drain, of the power amplifier circuit. An envelope tracking signal can be generated such as having a bandwidth that is compressed as compared to a full-bandwidth envelope signal. A peak-value "look ahead" technique can be used, for example, so that amplitude compression or clipping of the transmit signal is suppressed when the bandwidth-compressed envelope tracking signal is used to modulate a supply node of the power amplifier used to amplify the transmit signal.

33 Claims, 12 Drawing Sheets

(51) Int. Cl.
*H03F 1/32* (2006.01)
*H03F 3/19* (2006.01)
*H03F 3/24* (2006.01)
*H04B 1/04* (2006.01)
*H03F 3/21* (2006.01)
*H03K 5/15* (2006.01)

(52) U.S. Cl.
CPC .............. *H03F 3/21* (2013.01); *H03F 3/245* (2013.01); *H03K 5/15046* (2013.01); *H04B 1/0475* (2013.01); *H03F 2200/102* (2013.01); *H03F 2200/165* (2013.01); *H03F 2200/336* (2013.01); *H03F 2200/36* (2013.01); *H03F 2200/411* (2013.01); *H03F 2200/451* (2013.01); *H03F 2200/504* (2013.01)

(58) Field of Classification Search
USPC ...... 330/296, 136, 149; 455/114.3; 375/296, 375/297
See application file for complete search history.

(56) References Cited

U.S. PATENT DOCUMENTS

| | | |
|---|---|---|
| 8,620,233 B2 | 12/2013 | Brobston |
| 9,167,514 B2 | 10/2015 | Dakshinamurthy et al. |
| 2005/0110562 A1 | 5/2005 | Robinson et al. |
| 2014/0155002 A1 | 6/2014 | Dakshinamurthy et al. |
| 2014/0274227 A1 | 9/2014 | Drogi |

OTHER PUBLICATIONS

Gilabert, Pere L., et al., "Slew-Rate and Efficiency Trade-off in Slow Envelope Tracking Power Amplifiers", (2012), 4 pgs.

Jeong, Jinseong, et al., "Wideband Envelope Tracking Power Amplifier with Reduced Bandwidth Power Supply Waveform", (2009), 1381-1384.

Larson, L., et al., "Wideband Envelope Tracking Power Amplifiers for Wireless Communications", (2014), 32-37.

"European Application Serial No. 16198285.5, extended European Search Report dated Mar. 15, 2017", 9 pgs.

* cited by examiner

BROADBAND ENVELOPE TRACKING

CLAIM OF PRIORITY

This patent application claims the benefit of priority of Pratt et al., U.S. Provisional Patent Application Ser. No. 62/255,328, titled "BROADBAND ENVELOPE TRACKING," filed on Nov. 13, 2015, which is hereby incorporated by reference herein in its entirety.

TECHNICAL FIELD

This document pertains generally, but not by way of limitation, to modulation of a supply provided to a power amplifier circuit to facilitate tracking by the supply of an envelope of a signal to be amplified by the power amplifier circuit such as to enhance efficiency of power amplifier circuit operation.

BACKGROUND

Power amplifiers are generally used to amplify signals for transmission in a communications system. Such transmission can occur wirelessly between a transmitter and one or more receivers, or an output of a power amplifier can be coupled to a cable or transmission line to route a transmitted signal to one or more receivers. Various trade-offs can exist relating to configuration and operation of a power amplifier. For example, in communication systems using a digital modulation scheme or other scheme where coherent demodulation will be performed at the receiver, a linearity specification for power amplifier operation can be relatively stringent as compared to other applications. In one approach, in order to enhance linearity (and thereby reduce one or more of distortion or noise), a power amplifier can be operated using a fixed power supply or using a fixed signal provided to a drain input in the example of an RF power amplifier topology including one or more field-effect transistors (FETs). Using a fixed supply, an operating point of the amplifier can be established such that even peak values of an input signal do not drive the power amplifier into amplitude compression. However, use of a fixed supply specified to provide operation well away from amplitude compression generally comes at a cost of lower efficiency, particularly a lower "drain efficiency." Such a lower efficiency can result in a significant proportion of power supplied to the power amplifier (generally more than 90%) being dissipated as heat. In one approach, if a higher efficiency is desired, a power amplifier can instead be operated closer to—or even within—a range where amplitude compression occurs. However, such an approach can have disadvantages, because such compression is a non-linear behavior and as mentioned above, such non-linearity can result in unwanted distortion or noise in the amplified signal to be transmitted.

Overview

An envelope tracking scheme can be used, such as to modulate a supply node of a power amplifier circuit, to improve a transmit power amplifier circuit efficiency (e.g., a drain efficiency). For example, a magnitude or amplitude envelope of a signal to be modulated can be scaled and used to drive a node, such as a drain, of the power amplifier circuit. However, if a "full-bandwidth" envelope signal is used, then the signal chain including the envelope detection and envelope tracking driver circuit may itself be subject to stringent specifications regarding linearity, bandwidth, and efficiency. The present inventors have recognized, among other things, that use of a full-bandwidth envelope signal for envelope tracking can result in an envelope tracking signal chain that is unacceptably inefficient and may require a bandwidth well in excess of the bandwidth of the transmit signal being amplified.

Accordingly, the present inventors have also recognized, among other things, that an envelope tracking signal can be generated such as having a bandwidth that is compressed as compared to a full-bandwidth envelope signal. Amplitude compression or clipping of the transmit signal is suppressed when the bandwidth-compressed envelope tracking signal is used to modulate a supply node of the power amplifier used to amplify the transmit signal. In this manner, a power amplifier circuit efficiency can be enhanced while also providing acceptable linearity, particularly for transmit signals modulated using a digital modulation scheme where coherent demodulation will be performed at the receiver.

In an example, a technique such as a method for power amplifier supply modulation can include receiving discrete-time samples corresponding to a signal to be amplified, after a specified delay, by a power amplifier circuit, the samples defining a first bandwidth, identifying information representative of a peak magnitude of the signal within a specified temporal window defining a sequence of the discrete-time samples, establishing a value for a sample of an envelope tracking signal using the information indicative of the peak magnitude, filtering the envelope tracking signal to provide a bandwidth-compressed envelope tracking signal defining a second bandwidth that is narrower than the first bandwidth, modulating a supply node of the power amplifier circuit using an analog representation of the bandwidth-compressed envelope tracking signal, and temporally aligning the signal to be amplified by the power amplifier circuit with the bandwidth-compressed envelope tracking signal modulating the supply node of the power amplifier circuit.

In an example, an electronic circuit or system can include or can use a tapped delay line configured to store discrete-time samples corresponding to a signal to be amplified, after a specified delay, by a power amplifier circuit, the samples defining a first bandwidth, and a bandwidth-compressing envelope tracking circuit configured to receive the discrete-time samples from the tapped delay line, identify information representative of a peak magnitude within a specified temporal window defining a sequence of the discrete-time samples, the temporal window defined by the specified delay established by the tapped delay line, establish a value for a discrete-time sample of an envelope tracking signal using the information indicative of the peak magnitude, and filter the envelope tracking signal to provide a bandwidth-compressed envelope tracking signal defining a second bandwidth that is narrower than the first bandwidth, the bandwidth-compressed envelope tracking signal provided at an output of the bandwidth-compressing envelope tracking circuit for use by an envelope tracking driver circuit configured to modulate a supply node of the power amplifier, the bandwidth-compressed envelope tracking signal temporally aligned with the signal to be amplified by the power amplifier circuit.

This overview is intended to provide an overview of subject matter of the present patent application. It is not intended to provide an exclusive or exhaustive explanation of the invention. The detailed description is included to provide further information about the present patent application.

Figure 1A:
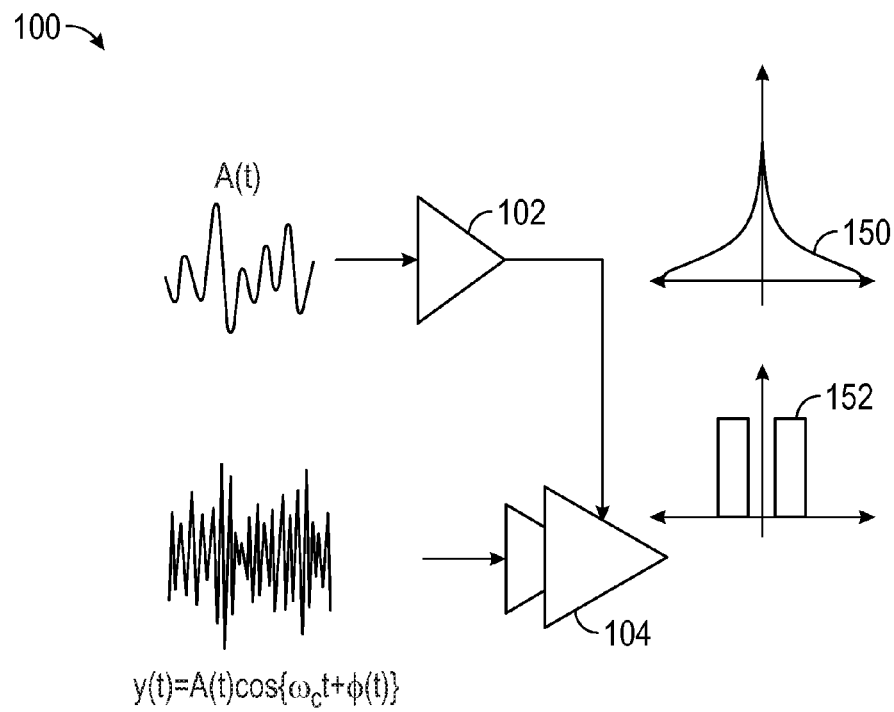
FIG. 1A illustrates generally an example of an envelope tracking system including an envelope tracking driver circuit and a power amplifier circuit.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

FIG. 1A illustrates generally an example of an envelope tracking system 100 including an envelope tracking driver circuit 102 and a power amplifier circuit 104. The envelope tracking driver circuit 102 can be used to modulate power being supplied to the power amplifier circuit 104. For example, the envelope tracking driver circuit 102 can be provided with a low power signal, such as representative of an envelope or magnitude of a transmit signal. As an illustrative example, the envelope signal can be represented by A(t), and the transmit signal can be represented by y(t)=A(t)cos $\{\omega_c t-\phi(t)\}$. The envelope tracking driver circuit 102 can linearly amplify the envelope signal A(t) to provide a higher-power signal to modulate a node such as a drain input of the power amplifier circuit 104. In this manner, the transmit signal y(t) can also be linearly amplified. In theory, the power amplifier circuit 104 efficiency can be enhanced using the envelope tracking scheme shown in FIG. 1A. However, as shown illustratively in FIG. 1B, if a full-bandwidth envelope signal is used, the overall system 100 efficiency can be degraded because the signal chain including the envelope tracking driver circuit 102 may be forced to operate using an envelope signal A(t) having a bandwidth much wider than the transmit signal y(t) bandwidth. In this manner, an efficiency improvement in the power amplifier circuit 104 operation is offset by a severe loss of efficiency in the envelope generation and envelope amplification signal chain. Other factors such as a limited slew rate capability may even preclude implementing a practical envelope tracking driver circuit 102 to modulate the power amplifier circuit 104 if a full-bandwidth envelope signal were provided as an input to the driver circuit 102.

Figure 1B:
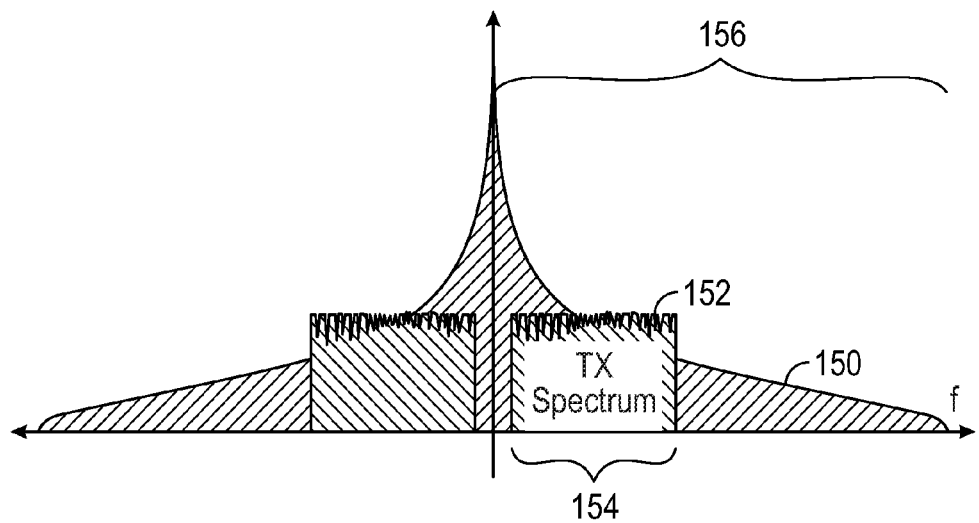
FIG. 1B includes illustrative examples of spectra corresponding to a transmission signal to be amplified and a corresponding full-bandwidth envelope signal.

FIG. 1B includes illustrative examples of spectra corresponding to a transmission signal 152 to be amplified and a corresponding full-bandwidth envelope signal 150. As mentioned above, a bandwidth 156 of the full-bandwidth envelope signal 150 far exceeds a bandwidth 154 of the transmission signal 152, and in an illustrative example, the full-bandwidth envelope signal 150 can occupy a bandwidth 156 more than twice as wide as the bandwidth 154 of the transmission signal 152. The full-bandwidth envelope signal 150 may even asymptotically approach a bandwidth of up to ten times the corresponding transmission signal bandwidth. Accordingly, use a full-bandwidth envelope signal 150 can result in overall loss of efficiency because savings provided by modulating the power amplifier circuit supply are lost and perhaps vastly exceeded) due to inefficiency in the detection and amplification signal chain used to generate the full-bandwidth envelope signal 150. As an illustrative example, if the transmission signal 152 include a bandwidth of about 1 GHz, a corresponding full-bandwidth envelope signal 150 can have a bandwidth 156 of about 10 GHz, and thus the envelope tracking driving circuit 102 of FIG. 1A would be configured to linearly amplify the 10 GHz envelope signal 150, contributing significant inefficiency to the system 100. As an illustrative example, a slew rate specification for an envelope tracking driver circuit might be impractically large if a full-bandwidth envelope signal is used, such as on the order of 100 kilovolts per microsecond (kV/μs).

Figure 1C:
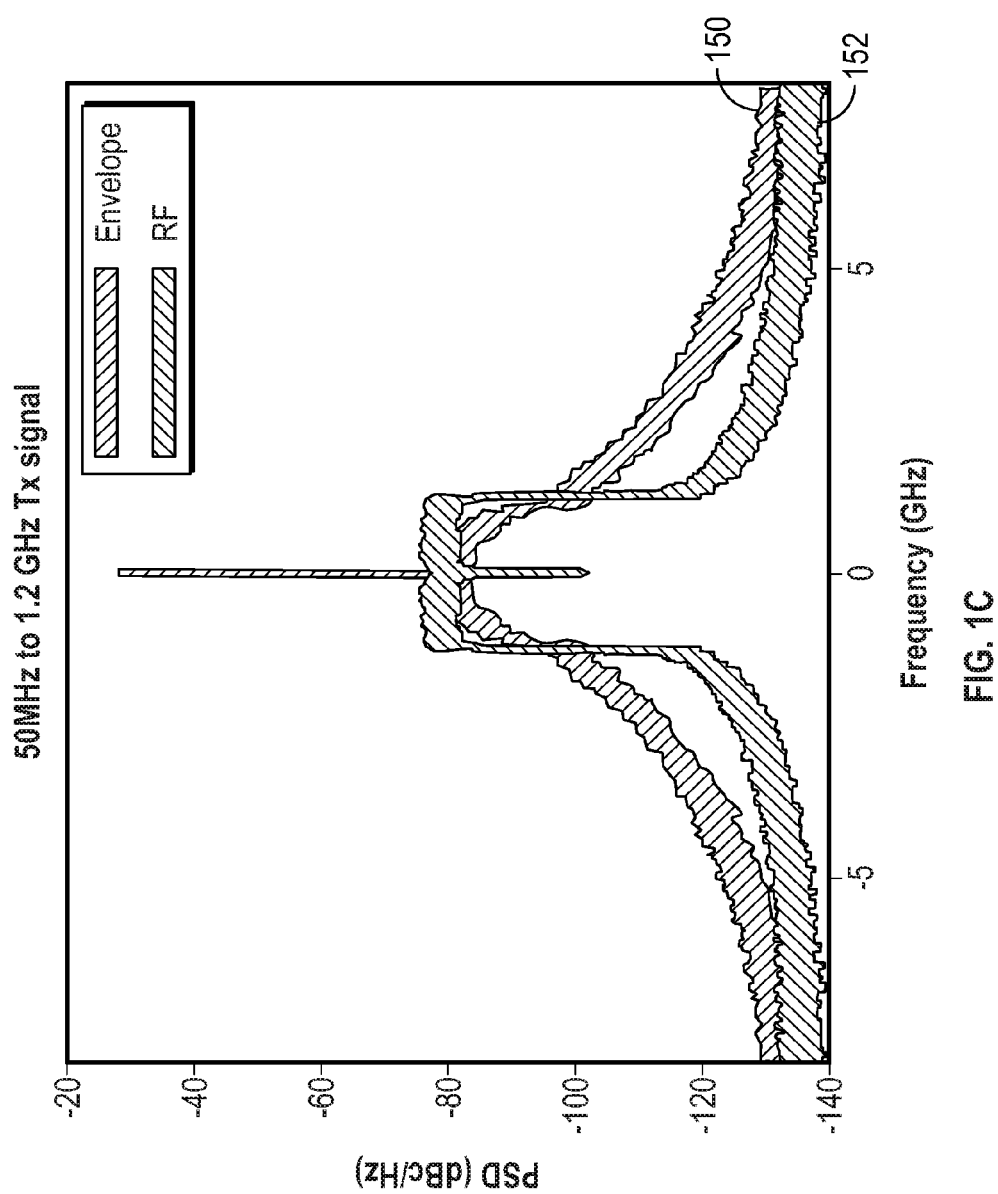
FIG. 1C includes an illustrative example of a power spectral density estimate extracted from a simulation of a transmission signal to be amplified and a corresponding envelope signal, where the transmission signal occupies a bandwidth from about 50 megahertz (MHz) to about 1.2 gigahertz (GHz).

FIG. 1C includes an illustrative example of a power spectral density estimate extracted from a simulation of a transmission signal 152 to be amplified and a corresponding full-bandwidth envelope signal 150, where the transmission signal 152 occupies a bandwidth from about 50 MHz to about 1.2 GHz, and the where the full-bandwidth envelope signal 150 occupies a much wider bandwidth including significant energy beyond 5 GHz.

Figure 2A:
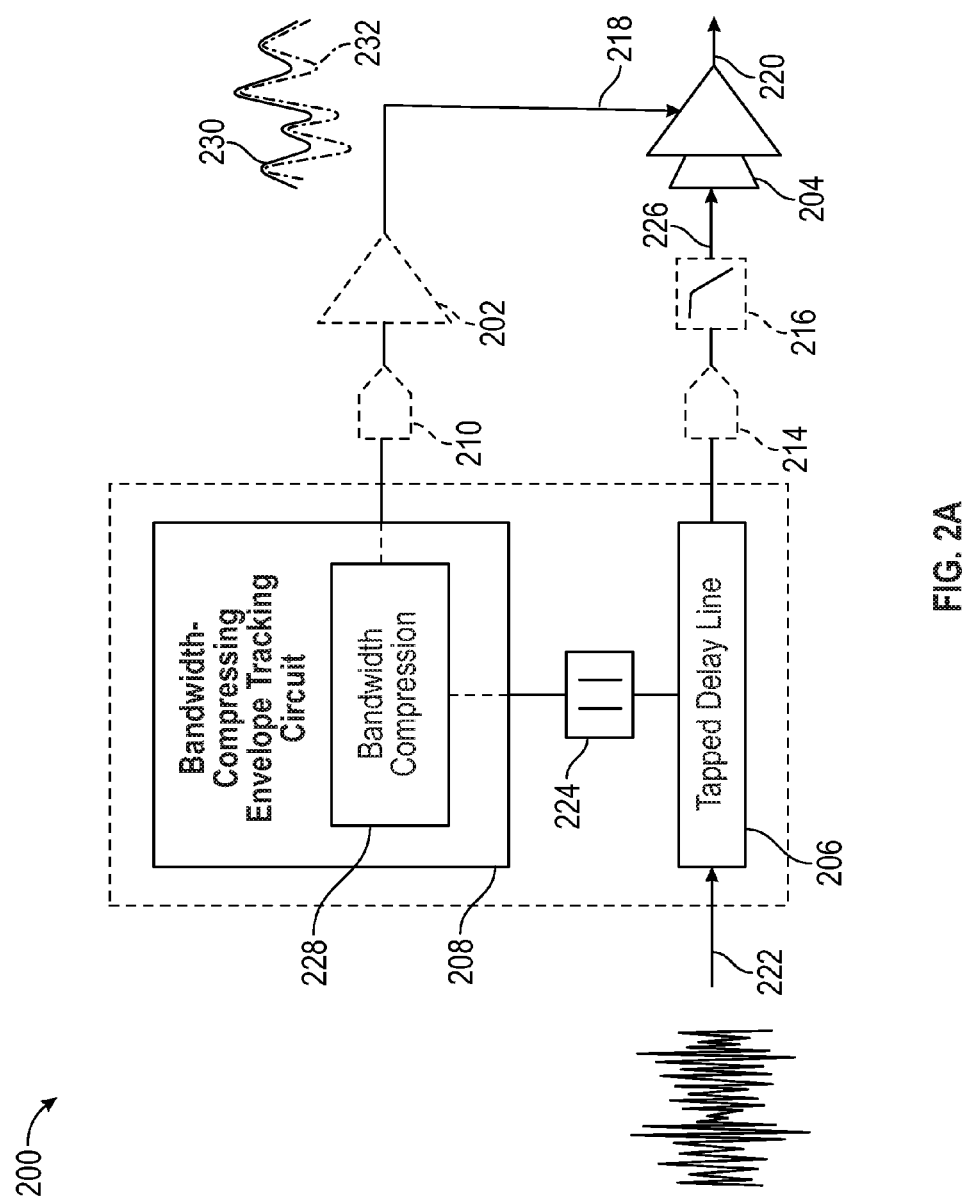
FIG. 2A illustrates generally an example of an envelope tracking system including a bandwidth-compressing envelope tracking circuit.

FIG. 2A illustrates generally an example of an envelope tracking system 200 including a bandwidth-compressing envelope tracking circuit 208. As mentioned above, an envelope tracking signal 230 can be generated such as having a bandwidth that is compressed as compared to a full-bandwidth envelope signal 232. Amplitude compression or clipping of the transmission signal is suppressed when the bandwidth-compressed envelope tracking signal 230 is used to modulate a supply node of a power amplifier circuit 204 used to amplify the transmission signal. In this manner, a power amplifier circuit 204 efficiency can be enhanced while also providing acceptable linearity.

Figure 3A:
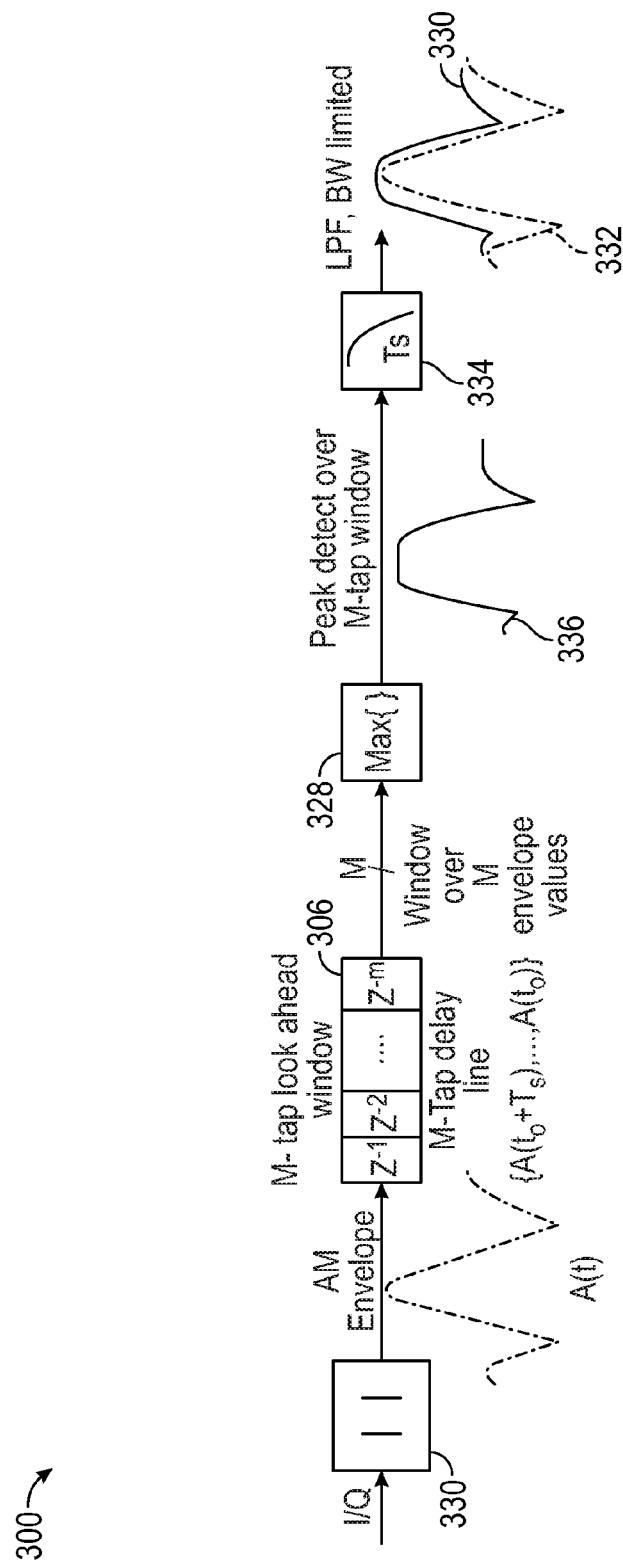
FIG. 3A illustrates generally a portion of a bandwidth-compressing envelope tracking technique and corresponding system elements.
Figure 4:
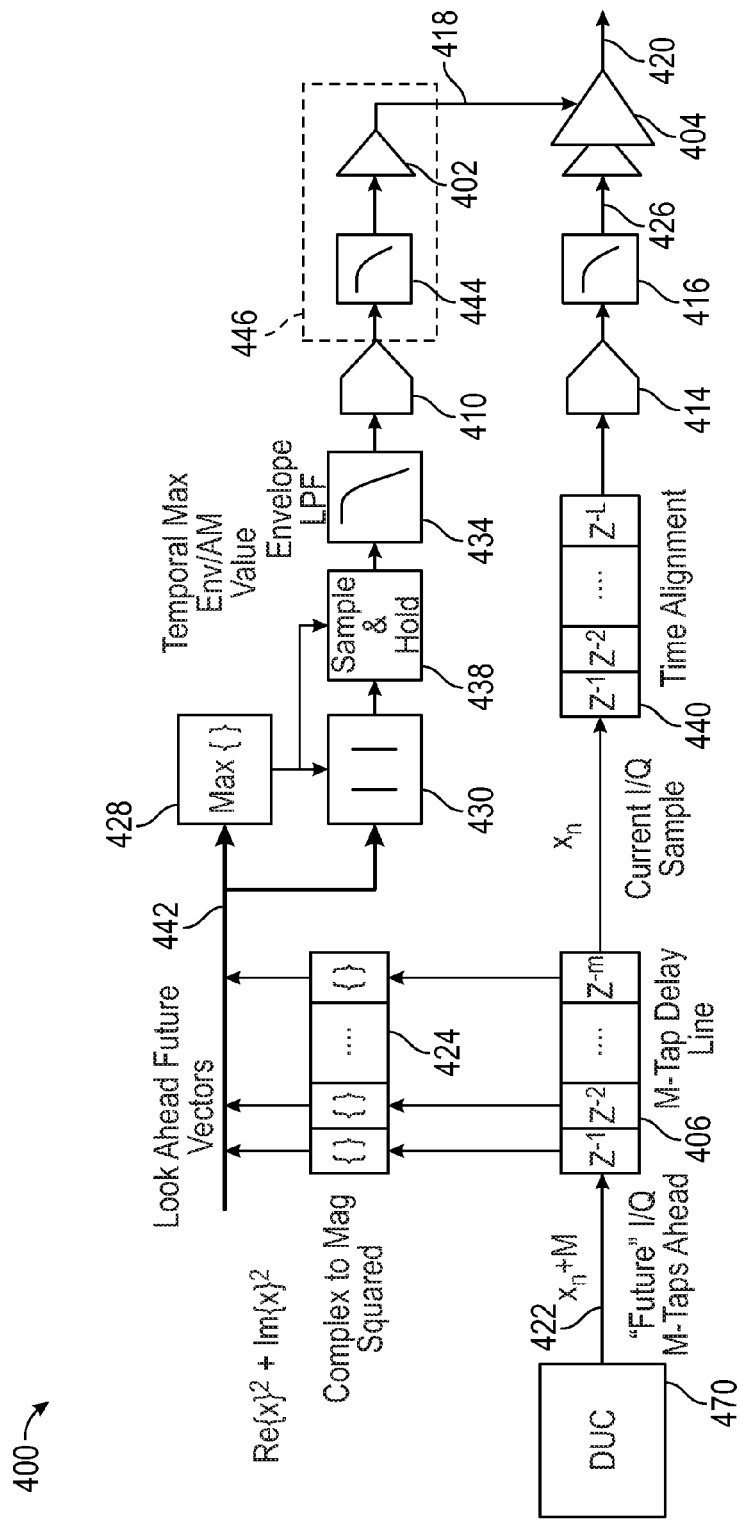
FIG. 4 illustrates generally a detailed example of at least a portion of a system that can include, provide, or use a bandwidth-compressed envelope tracking signal.

The bandwidth-compressing envelope tracking circuit can include a bandwidth compression element 228 (such as including a peak detection and filtering scheme as shown in other examples herein, e.g., portions of FIG. 3A or FIG. 4). A transmission signal to be amplified, such as represented by discrete-time samples or values can be provided to an input of a tapped delay line 206 or other circuit, such as can be used to extract a series of discrete-time samples within a specified temporal window (e.g., a "look ahead" window). The extracted samples can be processed by a detection element 224, such as to provide information representative of a full-bandwidth envelope signal corresponding to the transmission signal within the specified temporal window. The bandwidth compression element can be used to compress a bandwidth of the envelope tracking signal to provide a bandwidth-compressed envelope tracking signal. The bandwidth-compressed envelope signal can be used to modulate a supply node of the power amplifier circuit 220. For example, a discrete-time representation (e.g., digital representation) of the bandwidth-compressed envelope tracking signal can be provided to a first digital-to-analog converter (DAC) 210. An output of the DAC 210 can be coupled to an envelope tracking driver circuit 202, such as to amplify a low-level bandwidth-compressed envelope tracking signal to drive a supply of the power amplifier circuit 204 (e.g., to provide a modulated drain input to the power amplifier circuit 204). As described in other examples, filtering of the envelope tracking signal can be performed in the analog or digital domain, such as including use of one or more low-pass filters.

An output of the tapped delay line 206 can be provided to a second DAC 214, such as to convert a digital representation of the transmission signal to an analog representation, and one or more filters can be used to condition the transmission signal, such as a low-pass filter 216, before being amplified by the power amplifier circuit 220. The system 200 can provide enhanced power amplifier circuit 204 efficiency, including using a bandwidth-compressed envelope tracking signal 230 having a bandwidth less than the transmit signal provided at the input 222. The system 200 can include an additional delay element in the transmit signal chain, such as to temporally align the signal to be amplified by the power amplifier circuit 204 with the bandwidth-compressed envelope tracking signal 230 modulating the supply node of the power amplifier circuit 204.

Figure 2B:
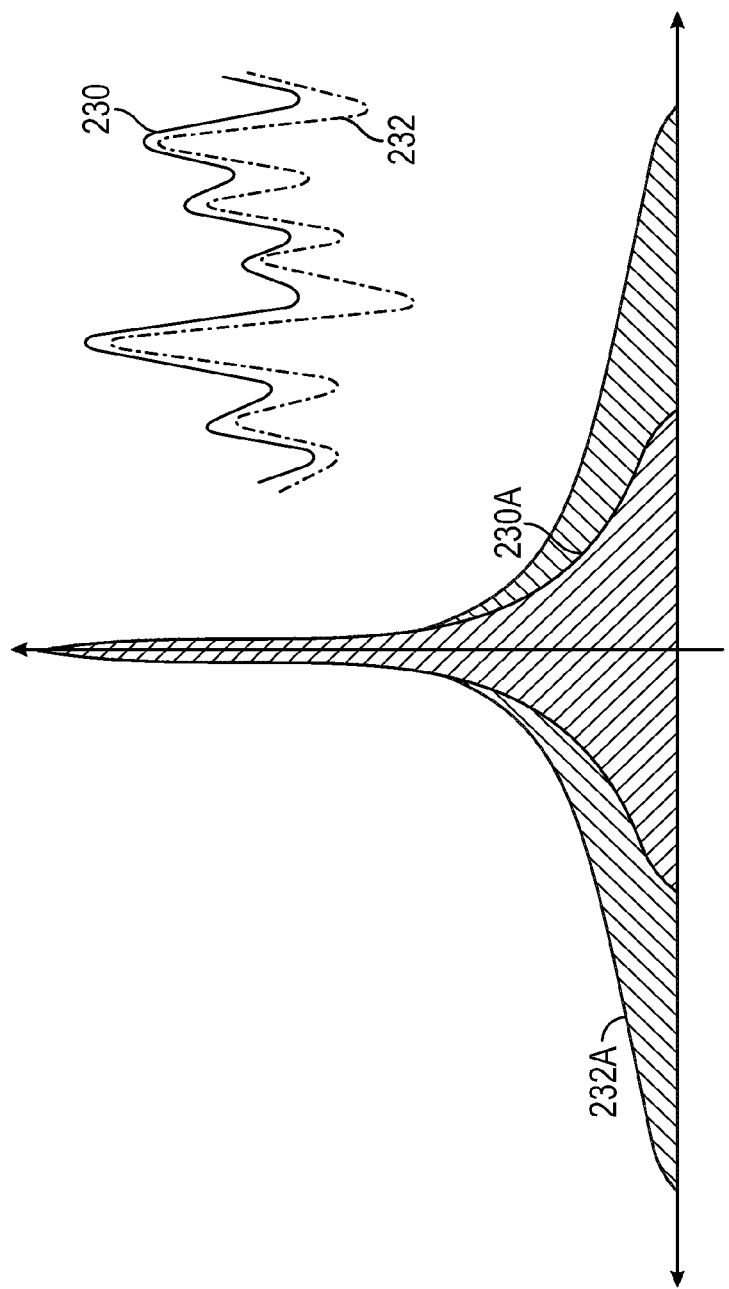
FIG. 2B includes illustrative examples of spectra corresponding to a full-bandwidth envelope spectrum and a compressed-bandwidth envelope spectrum, including an inset illustrating generally the corresponding time-domain envelope signals.

FIG. 2B includes illustrative examples of spectra corresponding to a full-bandwidth envelope spectrum 232A and a compressed-bandwidth envelope spectrum 230A, including an inset illustrating generally the corresponding time-domain envelope signals including the full bandwidth envelope signal 232, and a compressed-bandwidth envelope tracking signal 230. As mentioned above, use of a bandwidth-compressing envelope tracking scheme can relax the specifications for the envelope tracking signal chain so that efficiency enhancement in the power amplifier circuit 204 operation is not offset by degraded efficiency in the envelope tracking driver circuit 202 or elsewhere. As an illustrative example, a drain efficiency of the power amplifier circuit 204 can be enhanced to an intermediate level of efficiency, such as about 60%, using an envelope tracking driver circuit supporting a slew rate of about 10 kV/µs to amplify a bandwidth-compressed envelope tracking signal.

FIG. 3A illustrates generally a portion of a bandwidth-compressing envelope tracking technique and corresponding system elements. As mentioned above in relation to FIG. 2A, information representative of a magnitude of a transmission signal can be obtained, such as using a detector 330 or other technique. As mentioned in other examples, information representative of the magnitude need not exclusively refer to a magnitude value. For example, a magnitude-squared value can be used.

In-phase and quadrature representations of a signal to be transmitted can be provided to the detector 330, such as in the discrete-time or digital domain, and a signal representative of an envelope of the transmission signal can be provided to a tapped delay line 306 having "M" elements, corresponding to samples $Z^{-1}, Z^{-2}, \ldots, Z^{-M}$ of information corresponding to the signal to be transmitted. In the example of FIG. 3A, the elements of the delay line 306 can store samples of an envelope of the transmission signal over a duration corresponding to a specified delay. However, in other examples, discrete time samples of the transmission signal itself can be stored and detection can be performed to determine information representative of a magnitude of each of the samples after storage in the delay line 306, such as shown in the illustrative example of FIG. 4.

Figure 3B:
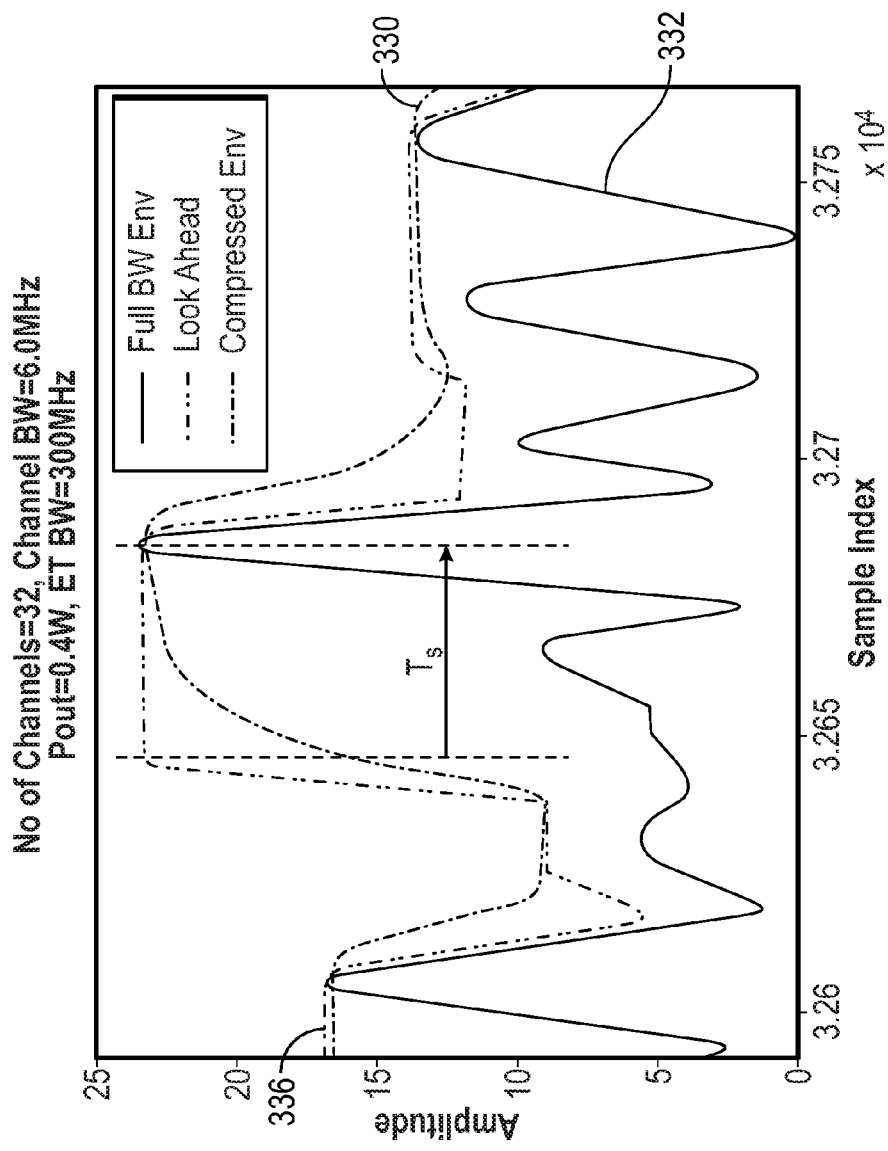
FIG. 3B includes illustrative examples comparing sampled representations of a full-bandwidth envelope signal, a signal representing a series of peak values extracted from a specified temporal window, such as provided using a "look ahead" tapped delay line as shown in FIG. 3A or elsewhere herein, and a bandwidth-compressed envelope tracking signal.

The delay line 306 can be provided as a sequence of delay registers in a cascaded configuration where incrementing a sample index of a sample in the transmission signal results in shifting of the elements of the delay line. The "M" values of the samples from the delay line can be provided to a maximum value detector 328 (e.g., a peak detector), and amongst the M values provided from the delay line (e.g., a window looking ahead to a particular sample index of the transmission signal), the maximum value detector 328 can output a value of the sample having the greatest magnitude. In this manner, peak detection is performed across the sliding "look ahead" window provided by the tapped delay line 306. An output time series 336 from the maximum detector 328 can include values corresponding to the detected peak information across a series of sample indices of the transmission signal, and the output time series 336 can be filtered, such as using a low-pass filter 334, to provide a bandwidth-compressed envelope tracking signal 330. As shown in FIG. 3A and FIG. 3B, the bandwidth-compressed envelope tracking signal 330 does not exactly match a shape of the full-bandwidth envelope signal 332. However, the bandwidth-compressed envelope tracking signal 330 avoids compression by remaining greater or no less than equal in magnitude to the full-bandwidth envelope signal 332, and generally tracks the full-bandwidth envelope signal 332.

The low-pass filter 334 can be implemented in the analog or digital domain. As described in other examples herein, the low-pass filter 334 can be provided entirely or in part by a frequency response of an envelope tracking driver circuit, or by an analog filter included as a portion of the envelope tracking driver circuit. The low-pass filter 334 (or the corresponding low-pass response of an envelope tracking driver circuit) can provide a latency or settling time, such as can be represented by a duration, $T_S$. Accordingly, a duration corresponding to the delay provided by the delay line 306 can be established at least in part using information about a settling time, $T_S$, or a time constant, $\tau$, of the low-pass filter 334.

Figure 7:
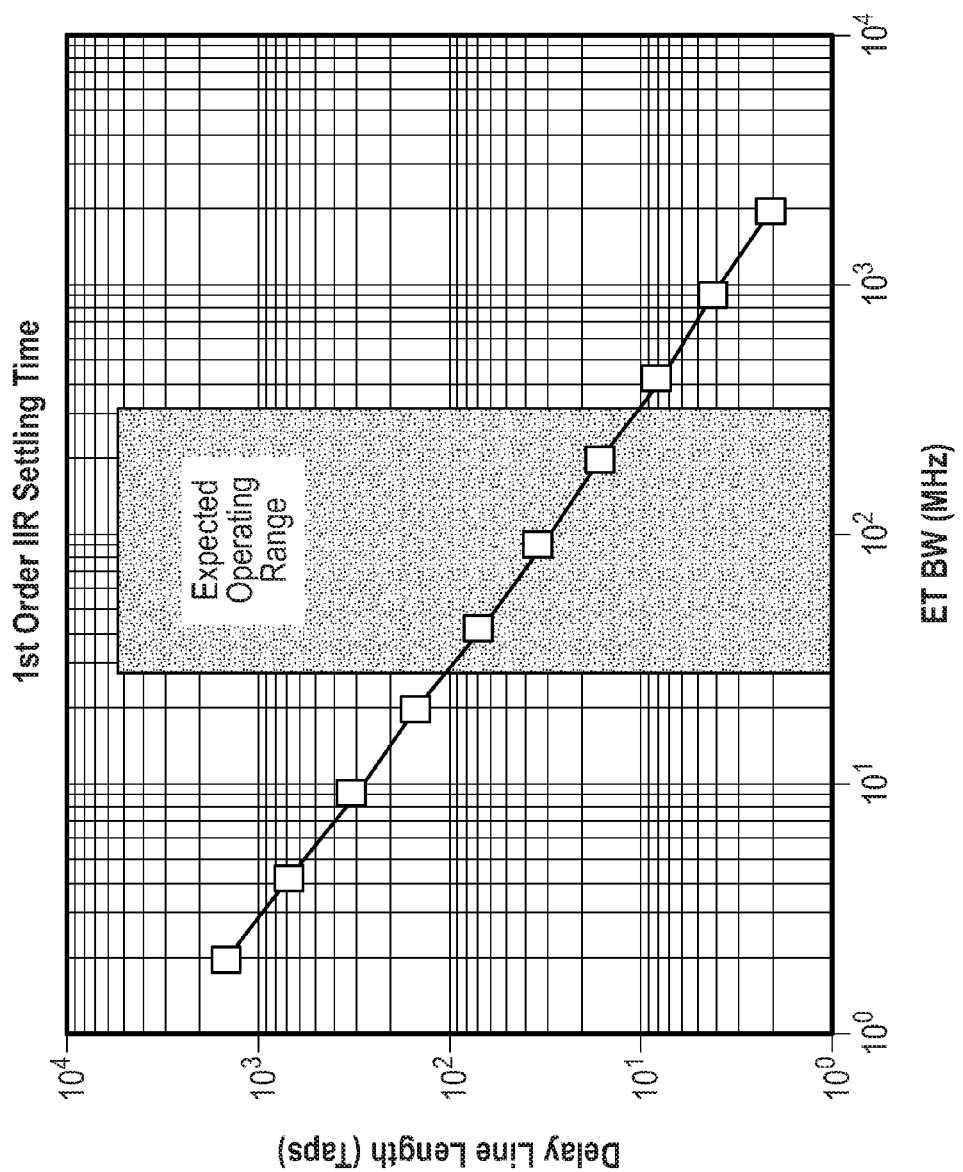
FIG. 7 includes an illustrative example of a delay line length (specified in "taps") versus an envelope tracking signal bandwidth.

For example, a duration corresponding to the delay provided by the delay line 306 can be established to be at least $T_S$ in duration, or a specified multiple of the time constant, τ, such as three times as long in duration as τ, or six times as long in duration as τ. In this manner, the bandwidth-compressed envelope tracking signal 330 can remain greater or at worst, no less than equal in magnitude to the full-bandwidth envelope signal 332 at all times. As an illustration, if the full-bandwidth envelope signal is represented by A(t), and if the delay defines a duration corresponding to the settling time, $T_S$, the rightmost tap of the delay line can include a value of the envelope signal A(t) at $t_0$, and the leftmost tap of the delay line can include a value of the envelope signal A(t) at $\{t_0+T_S\}$. FIG. 7, below, illustrates generally a relationship between delay line tap length and envelope tracking signal bandwidth, such as can be used to aid in selecting an appropriate count of taps in a delay line to achieve a desired settling time.

FIG. 3B includes illustrative examples comparing sampled representations of a full-bandwidth envelope signal 332, a signal 336 representing a series of peak values extracted from a specified temporal window, such as provided using a "look ahead" tapped delay line 306 as shown in FIG. 3A or elsewhere herein, and a bandwidth-compressed envelope tracking signal 330. In the illustrative example of FIG. 3B, a total bandwidth occupied by 32 channels each having a bandwidth of 6.0 MHz can be about 500 MHz including channel separation. The compressed-bandwidth envelope tracking signal 330 can have a bandwidth less than about 300 MHz. The "look ahead" behavior of the peak-tracking signal 336 and the filtered bandwidth-compressed envelope tracking signal 330 is apparent in FIG. 3B, which shows that the peak-tracking signal 336 achieves a value corresponding to a peak in the full-bandwidth envelope signal 332 at time before the peak occurs in the full-bandwidth envelope signal 332. In an illustrative example, the delay established by the delay line 306 can be at least $T_S$, so that a duration of at least $T_S$ separates the peak in the peak signal 336 from a corresponding peak in the full-bandwidth enveloped signal 332 to account for filter latency or settling. In this manner, the bandwidth-compressed envelope tracking signal 330 has adequate time to transition to the peak value without causing compression or clipping of the power amplifier circuit.

Figure 3C:
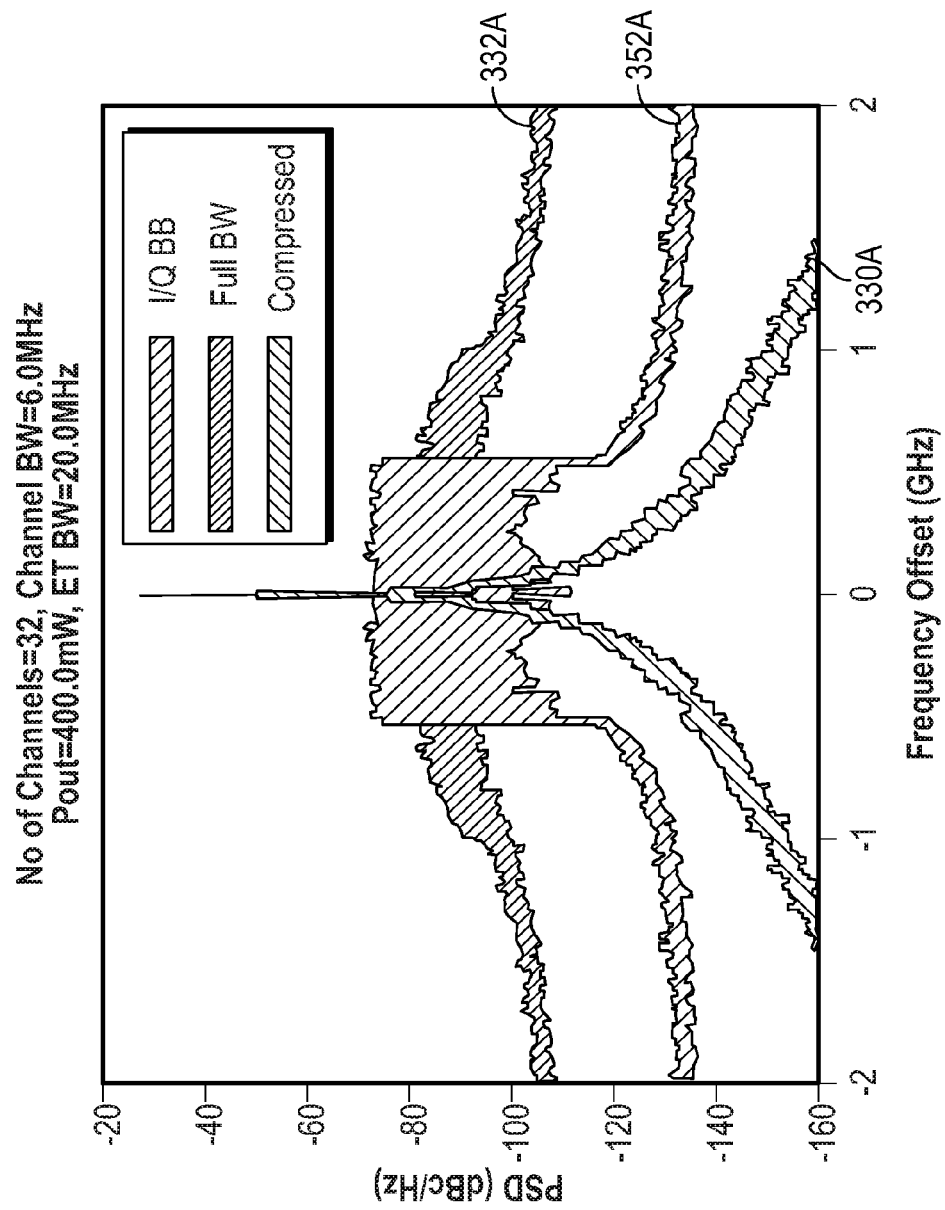
FIG. 3C includes illustrative examples showing respective power spectral density estimates extracted from simulations representing a baseband transmission signal to be amplified, a corresponding full-bandwidth envelope signal, and a corresponding bandwidth-compressed envelope tracking signal.
Figure 6:
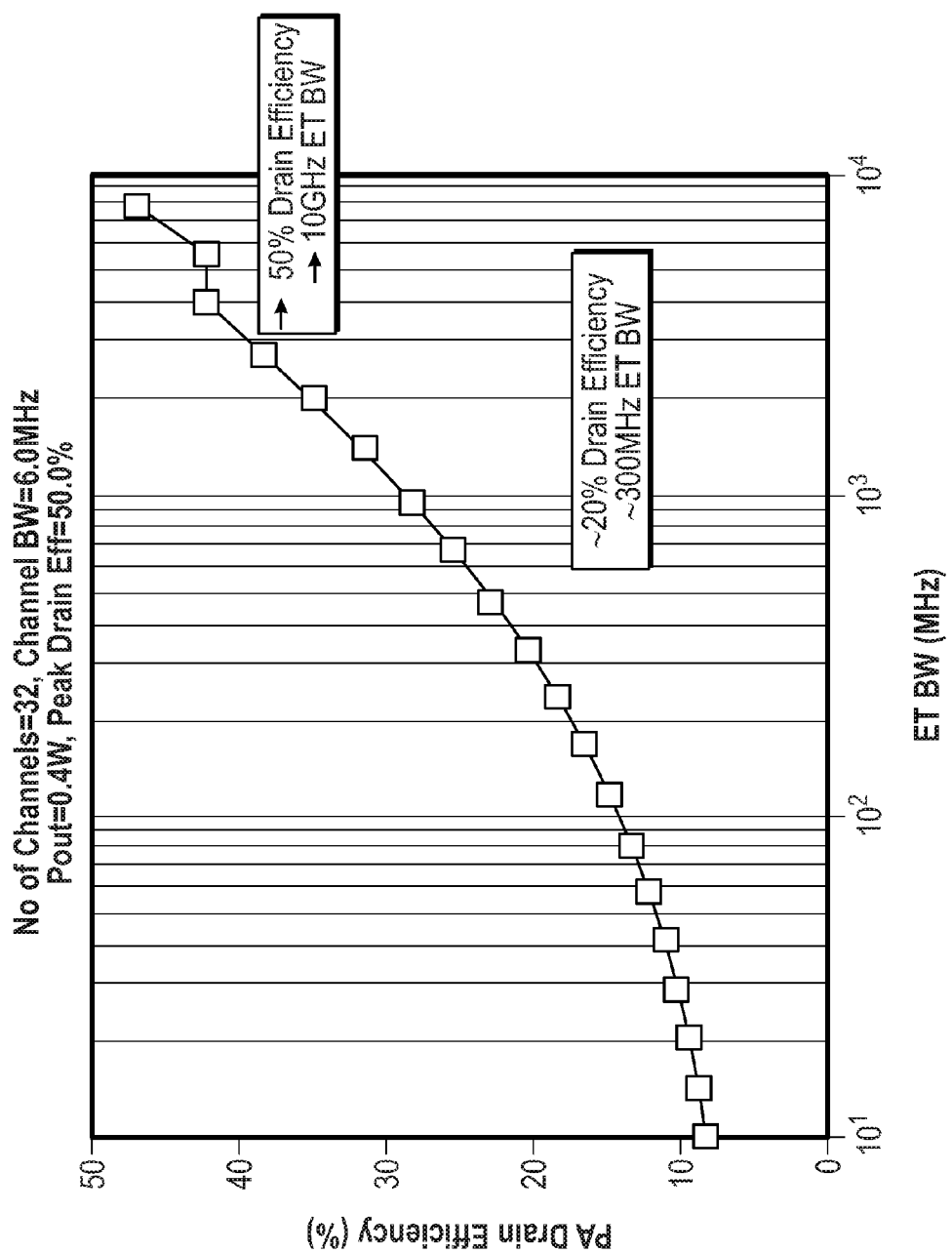
FIG. 6 includes an illustrative example of a simulated drain efficiency of a power amplifier plotted versus an envelope tracking signal bandwidth.

FIG. 3C includes illustrative examples showing respective power spectral density estimates extracted from simulations representing a baseband transmission signal to be amplified 352A, a corresponding full-bandwidth envelope signal 332A, and a corresponding bandwidth-compressed envelope tracking signal 330A. Use of a compressed-bandwidth envelope tracking signal as shown in FIG. 3C can relax specifications for an envelope tracking signal chain, such as reducing a bandwidth of the envelope tracking signal chain from about 1 GHz or more to a significantly lesser bandwidth, such as about 20 MHz, according to an illustrative example. FIG. 6, below, illustrates generally an illustrative example of a tradeoff that can exist between power amplifier circuit drain efficiency, and a specified envelope tracking bandwidth.

FIG. 4 illustrates generally a detailed example of at least a portion of a system 400 that can include, provide, or use a bandwidth-compressed envelope tracking signal. In the example of FIG. 4, a digital upconversion element (DUC) 470 or other element can provide discrete-time samples of a signal to be transmitted, such as samples defined by values corresponding to in-phase and quadrature (I/Q) components of the transmission signal. A sample including an imaginary-valued portion and a real-valued portion can be referred to generically as a "complex sample." In an illustrative example, the real-valued portion can correspond to the in-phase component of a sample, and the imaginary-valued portion can correspond to the quadrature component of the sample.

A tapped delay line 406 can store either real-valued or complex-valued samples, such as including "M" elements, corresponding to samples $Z^{-1}, Z^{-2}, \ldots, Z^{-M}$ of information corresponding to the signal to be transmitted. If complex-valued samples are used, a magnitude-squared detector 424 can be used to determine a magnitude-squared value for each complex sample stored in the delay line 406. In this manner, a look-ahead "vector" is provided to a maximum value detector 428. A sample having the greatest magnitude-squared value will also have the greatest magnitude, so the output of the maximum value detector 428 can provide a temporal peak location, $t_{max}$, to a magnitude detector 430, and the actual magnitude need only be determined for the sample corresponding to the temporal peak location. In this manner, a full CORDIC magnitude need not be determined for every complex-valued sample stored in the delay line, enhancing efficiency as compared to an approach where an actual magnitude is determined for each sample in the look-ahead vector. As an illustrative example, an output of the magnitude detector 430 can be provided to a sample-and-hold 438, such as to store a maximum magnitude value for a particular look-ahead vector.

An output of the sample-and-hold 438 can be filtered, such as in the discrete-time or digital domain using an envelope low-pass filter 434. Alternatively, or in addition, one or more of an analog filter 444 or a frequency response of an envelope tracking driver circuit 402 can be used to perform low-pass filtering). For example, elimination of the envelope low-pass filter 434 and using analog filtering can provide power savings in certain applications where filtering provided by an envelope tracking analog circuit block 446 is sufficient. An output of the sample-and-hold 438 and envelope low-pass filter 434 (if present) can be provided to a first digital-to-analog converter 410, such as to provide an analog signal representative of the bandwidth-compressed envelope tracking signal (or an intermediate signal that is further filtered by the envelope tracking analog circuit block 446).

An output of the envelope tracking driver circuit 402 can be provided to a power amplifier circuit 404. The transmission signal can become temporally misaligned with the output 418 of the envelope tracking signal chain, such as due to group delay through one or more filter elements or other sources of delay. Accordingly, a representation of the transmission signal provided to the input 426 of the power amplifier circuit 404 can be re-aligned such as using a further delay line 440 (or otherwise configuring the delay line 406) such as to provide additional delay elements that are not used for determination of the look-ahead vector. For example, a discrete-time or digital time-alignment delay line 440 can be coupled to the first delay line 406. A second digital-to-analog converter 414 can receive samples (such as complex-valued samples) representing the transmission signal, and can provide an analog representation of the transmission signal. Another low-pass filter 416 can be included, such as to filter the transmission signal before the signal is amplified by the power amplifier circuit. An output 420 of the power amplifier circuit can be coupled to a transmission medium, such as a cable or transmission line. Alternatively, the output 420 can be coupled to other circuitry, such as a matching network or antenna, as a portion of a wireless communication system.

Figure 5:
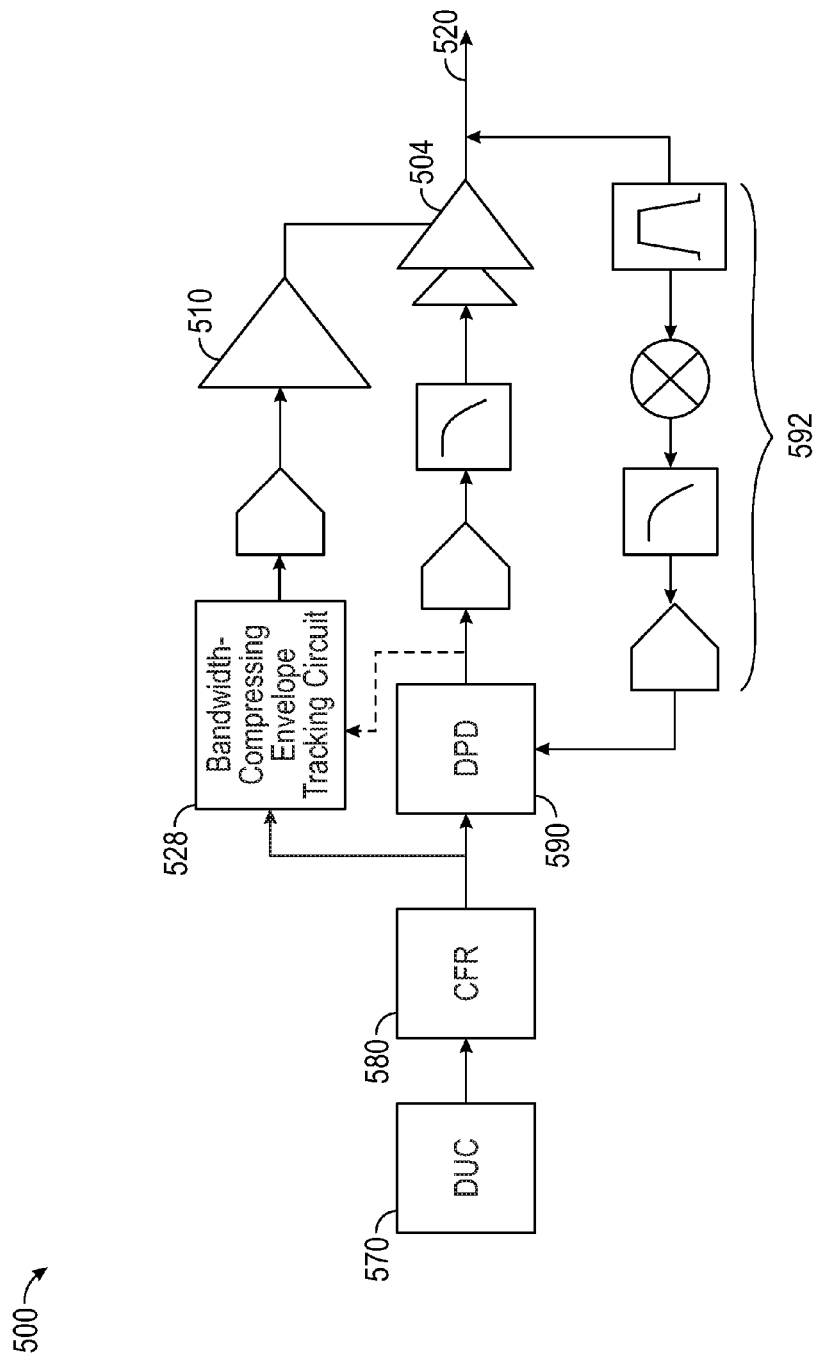
FIG. 5 illustrates generally an example of a system, such as can be included as a portion of a cable modem or cable transceiver, the system including a bandwidth-compressing envelope tracking circuit.

FIG. 5 illustrates generally an example of a system 500, such as can be included as a portion of a cable modem or cable transceiver, the system including a bandwidth-compressing envelope tracking circuit 528. In the example shown in FIG. 5, various system elements such as a digital upconversion element 570, a crest-factor reduction (CFR) element 580, and a digital pre-distortion (DPD) element 590 can be included. A feedback signal chain 592 can be provided, such as for use by the DPD element 590 to perform a closed-loop DPD scheme using information obtained from an output 520 of the power amplifier circuit.

A digital signal representative of a signal to be transmitted can be coupled from one or more of an output of the crest factor reduction (CFR) element 580 or the digital pre-distortion element 590 to the bandwidth-compressing envelope tracking circuit 528. As an illustrative example, one or more of the DUC element 570, the CFR element 580, the DPD element 590, or the bandwidth-compressing envelope tracking circuit 528 can be co-integrated in a commonly shared integrated circuit or module, such as implemented using one or more of general-purpose processor circuits, field-programmable gate arrays (FPGAs) or other programmable logic devices, digital signal processor circuits, or application-specific circuits. An output of the bandwidth-compressed envelope tracking circuit can be converted from a discrete-time (e.g., digital) representation to an analog representation, such as for amplification by an envelope tracking driver circuit 510 coupled to a supply node of a power amplifier circuit 504 as in other examples described herein.

As an illustrative example, a factor of 100:1 bandwidth compression (e.g., a 100-to-1 ratio) can be used, such as to provide a bandwidth-compressed envelope tracking signal having about a 10 MHz bandwidth to modulate a power amplifier circuit to transmit a signal having a full-bandwidth envelope occupying about 1 GHz. Use of the 100:1 bandwidth compression can improve a drain efficiency of a power amplifier circuit from about 2% to approaching 50%, such as in a cable modem application. Other bandwidth compression ratios can be used, such as 5:1, 10:1, 50:1, or other values, as illustrative examples.

FIG. 6 includes an illustrative example of a simulated drain efficiency of a power amplifier plotted versus an envelope tracking signal bandwidth. A drain efficiency of a power amplifier lacking supply modulation using an envelope tracking scheme is generally less than 10%, and can be as little as 2%, in an illustrative example. FIG. 6 shows that an efficiency well above 10% can be achieved, using a compressed-bandwidth envelope tracking signal having a bandwidth of about 100 MHz or more, under the conditions shown in FIG. 6. The efficiencies plotted in FIG. 6 assume use of a 1 GHz Orthogonal Frequency Division Multiplexing (OFDM) modulation scheme and a Class A power amplifier circuit topology, such as corresponding to a cable modem application.

FIG. 7 includes an illustrative example of a delay line length (specified in "taps") versus an envelope tracking signal bandwidth. A tapped delay line length can be specified in terms of a number of a delay elements or "taps," and a count of the taps can be determined at least in part using information about a filter settling time. For example, a first order Infinite Impulse Response (IIR) digital low-pass filter can be used to filter a signal representative of peak information extracted from a tapped digital delay line to generate a compressed-bandwidth envelope tracking signal, as described in other examples herein. Such a filter can be referred to as an envelope low-pass filter. For compressing bandwidth envelope tracking signals having bandwidths in the range from about 10 MHz to about 100 MHz, a power budget for a corresponding delay line length as shown in FIG. 7 is about 10 milliwatts (mW) to about 100 mW. A corresponding IIR filter can have a power budget of about 40 mW. Other elements in a digital signal chain for generating the compressed-bandwidth envelope tracking signal can include an AM envelope detector and maximum value detector, such as having a power budget of about 100 mW total. Accordingly, a compressed-bandwidth envelope tracking signal chain (such as shown illustratively in FIG. 4) can be implemented digitally for a power budget of about 250 mW, according to an illustrative example. If the envelope low-pass filter is omitted (such as instead using an analog filter or the envelope tracking driver circuit itself), the digital power budget can be correspondingly reduced.

Figure 8:
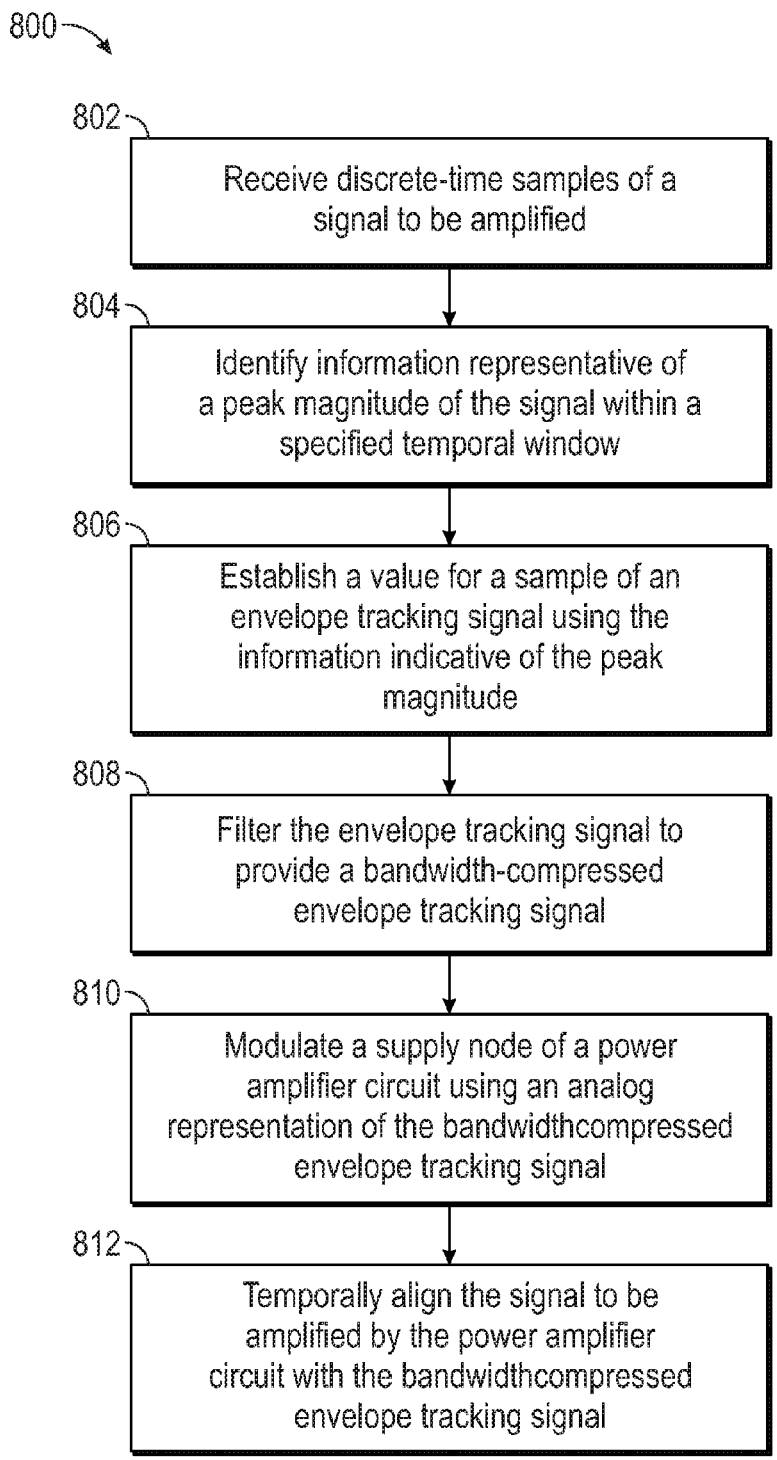
FIG. 8 illustrates generally a technique, such as a method, that include modulating a supply node of a power amplifier circuit using a representation of a bandwidth-compressed envelope tracking signal.

FIG. 8 illustrates generally a technique 800, such as a method, that include modulating a supply node of a power amplifier circuit using a representation of a bandwidth-compressed envelope tracking signal. The technique of FIG. 8 can be performed, such as using apparatus as shown and described in relation to one or more of FIG. 2A, FIG. 3A, FIG. 4, or FIG. 5, for example. At 802, discrete-time samples of a signal to be amplified can be received, such as from a digital upconversion (DUC) element, or other portion of a communication system. The samples can define a first bandwidth, such as corresponding to a full-bandwidth envelope of the signal to be transmitted.

At 804, information representative of a peak magnitude of the signal within the specified temporal window can be identified, such as to define a sequence of discrete-time samples. At 806, a value of a sample of an envelope tracking signal can be established using the information indicative of the peak magnitude. Such an envelope tracking signal can represent a peak "look ahead" signal. At 808, the envelope tracking signal, such as representing the peak "look ahead" signal can be filtered to provide a bandwidth-compressed envelope tracking signal. The bandwidth-compressed envelope tracking signal can define a second bandwidth that is narrower than the first bandwidth.

At 810, a supply node of a power amplifier circuit can be modulated, such as using an analog representation of the bandwidth-compressed envelope tracking signal. For example, the supply node can be driven using an envelope tracking driver circuit. At 812, the signal to be amplified by the power amplifier circuit can be temporally aligned with the bandwidth-compressed enveloped tracking signal modulating the supply node of the power amplifier circuit. For example, a group delay of an envelope low-pass filter can cause a temporal misalignment between the signal being amplified and the bandwidth-compressed envelope tracking signal. Accordingly, a delay can be introduced in the transmission signal chain, such as using a discrete-time (e.g., digital) delay line to compensate for such group delay.

VARIOUS NOTES & EXAMPLES

Example 1 is a technique, such as a method, for power amplifier supply modulation comprising receiving discrete-time samples corresponding to a signal to be amplified, after a specified delay, by a power amplifier circuit, the samples defining a first bandwidth, identifying information representative of a peak magnitude of the signal within a specified temporal window defining a sequence of the discrete-time samples, establishing a value for a sample of an envelope tracking signal using the information indicative of the peak magnitude, filtering the envelope tracking signal to provide a bandwidth-compressed envelope tracking signal defining a second bandwidth that is narrower than the first bandwidth, modulating a supply node of the power amplifier circuit using an analog representation of the bandwidth-compressed envelope tracking signal, and temporally aligning the signal to be amplified by the power amplifier circuit with the bandwidth-compressed envelope tracking signal modulating the supply node of the power amplifier circuit.

In Example 2, the subject matter of Example 1 optionally includes that the receiving the discrete-time samples corresponding to the signal to be amplified includes storing the discrete-time samples in a tapped delay line providing a specified delay defining the window.

In Example 3, the subject matter of Example 2 optionally includes temporally aligning the signal to be amplified by the power amplifier with the bandwidth-compressed envelope tracking signal using a second delay line.

In Example 4, the subject matter of any one or more of Examples 1 through 3 optionally include operating the power amplifier circuit in a non-saturation region using the modulated supply node.

In Example 5, the subject matter of any one or more of Examples 1 through 4 optionally include that the discrete-time samples each include an in-phase component and a quadrature component, and that the identifying the information indicative of the peak magnitude includes determining a magnitude squared value comprising a value of the in-phase component squared plus a value of the quadrature component squared.

In Example 6, the subject matter of Example 5 optionally includes that the identifying the information indicative of the peak magnitude includes identifying the discrete-time sample in the window having the maximum magnitude squared value.

In Example 7, the subject matter of Example 6 optionally includes that the establishing the value for a discrete-time sample of the envelope tracking signal using the information indicative of the peak magnitude includes determining a magnitude of the sample having the maximum magnitude squared value.

In Example 8, the subject matter of any one or more of Examples 1 through 7 optionally include that the filtering the envelope tracking signal uses a discrete-time low-pass filter.

In Example 9, the subject matter of any one or more of Examples 1 through 8 optionally include that the modulating the supply node includes using an envelope tracking driver circuit, and that the filtering is provided by a frequency response of the envelope tracking driver circuit.

Example 10 is an electronic circuit, comprising a tapped delay line configured to store discrete-time samples corresponding to a signal to be amplified, after a specified delay, by a power amplifier circuit, the samples defining a first bandwidth, and a bandwidth-compressing envelope tracking circuit configured to receive the discrete-time samples from the tapped delay line, identify information representative of a peak magnitude within a specified temporal window defining a sequence of the discrete-time samples, the temporal window defined by the specified delay established by the tapped delay line, establish a value for a discrete-time sample of an envelope tracking signal using the information indicative of the peak magnitude, and filter the envelope tracking signal to provide a bandwidth-compressed envelope tracking signal defining a second bandwidth that is narrower than the first bandwidth, the bandwidth-compressed envelope tracking signal provided at an output of the bandwidth-compressing envelope tracking circuit for use by an envelope tracking driver circuit configured to modulate a supply node of the power amplifier, the bandwidth-compressed envelope tracking signal temporally aligned with the signal to be amplified by the power amplifier circuit.

In Example 11, the subject matter of Example 10 optionally includes the envelope tracking driver circuit, that the envelope tracking driver circuit is configured modulate the supply node of the power amplifier using an analog representation of the bandwidth-compressed envelope tracking signal.

In Example 12, the subject matter of any one or more of Examples 10 through 11 optionally include that the discrete-time samples each include an in-phase component and a quadrature component, and that the bandwidth-compressing envelope tracking circuit is configured to identify the information indicative of the peak magnitude including: determining a magnitude squared value comprising a value of the in-phase component squared plus a value of the quadrature component squared including retrieving the values of the in-phase and quadrature components from storage locations in a memory, and identifying the discrete-time sample in the window having the maximum magnitude squared value.

In Example 13, the subject matter of Example 12 optionally includes that the bandwidth-compressing envelope tracking circuit includes an arithmetic processor circuit that is configured to establish the value for the discrete-time sample of the envelope tracking signal using the information indicative of the peak magnitude including determining a magnitude of the sample having the maximum magnitude squared value without requiring use of a arithmetic multiplier circuit.

In Example 14, the subject matter of any one or more of Examples 10 through 13 optionally include a second delay line in a signal path coupled to an input of the power amplifier, the second delay line configured to temporally align the signal to be amplified by the power amplifier with the bandwidth-compressed envelope tracking signal.

In Example 15, the subject matter of any one or more of Examples 10 through 14 optionally include that the bandwidth-compressing envelope tracking circuit comprises a low-pass filter configured to filter the envelope tracking signal to provide the bandwidth-compressed envelope tracking signal.

In Example 16, the subject matter of any one or more of Examples 10 through 15 optionally include the power amplifier.

Example 17 is an electronic circuit, comprising a tapped delay line configured to store discrete-time samples corresponding to a signal to be amplified, after a specified delay, by a power amplifier circuit, the samples defining a first bandwidth, an envelope tracking circuit configured to: receive the discrete-time samples from the tapped delay line, identify information representative of a peak magnitude within a specified temporal window defining a sequence of the discrete-time samples, the temporal window defined by a specified delay established by the tapped delay line, establish a value for a discrete-time sample of an envelope tracking signal using the information indicative of the peak magnitude, and an envelope tracking driver circuit configured modulate the supply node of the power amplifier using an analog representation of the bandwidth-compressed envelope tracking signal, the analog representation obtained at least in part by filtering the envelope tracking signal to provide a bandwidth-compressed envelope tracking signal, the bandwidth-compressed envelope tracking signal temporally aligned with the signal to be amplified by the power amplifier circuit to avoid saturation of the power amplifier, and that the filtering is provided at least in part by a frequency response of the envelope tracking driver circuit.

In Example 18, the subject matter of Example 17 optionally includes that the frequency response is established by an amplifier circuit comprising the envelope tracking driver circuit.

In Example 19, the subject matter of any one or more of Examples 17 through 18 optionally include that the frequency response is established by an analog low-pass filter included as a portion of the envelope tracking driver circuit.

In Example 20, the subject matter of any one or more of Examples 17 through 19 optionally include that the filtering is also provided at least in part using a discrete-time filter circuit.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A method for power amplifier supply modulation comprising:
   receiving discrete-time samples corresponding to a signal to be amplified, after a specified delay, by a power amplifier circuit, the discrete-time samples defining a first bandwidth;
   identifying information representative of a peak magnitude of the signal within a specified temporal window defining a sequence of the discrete-time samples;
   establishing a value for a sample of an envelope tracking signal using the information indicative of the peak magnitude;
   filtering the envelope tracking signal to provide a bandwidth-compressed envelope tracking signal defining a second bandwidth that is narrower than the first bandwidth;
   modulating a signal provided to a power supply node of the power amplifier circuit using an analog representation of the bandwidth-compressed envelope tracking signal; and
   temporally aligning the signal to be amplified by the power amplifier circuit with the bandwidth-compressed envelope tracking signal modulating the signal provided to the power supply node of the power amplifier circuit;
   wherein identifying the information indicative of the peak magnitude includes determining a magnitude squared value.

2. The method of claim 1, wherein receiving the discrete-time samples corresponding to the signal to be amplified includes storing the discrete-time samples in a tapped first delay line providing a specified delay defining the window.

3. The method of claim 2, comprising temporally aligning the signal to be amplified by the power amplifier with the bandwidth-compressed envelope tracking signal using a second delay line.

4. The method of claim 1, comprising operating the power amplifier circuit in a non-saturation region using the modulated signal provided to the power supply node.

5. The method of claim 1, wherein the discrete-time samples each include an in-phase component and a quadrature component; and
wherein identifying the information indicative of the peak magnitude includes determining a magnitude squared value comprising a value of the in-phase component squared plus a value of the quadrature component squared.

6. The method of claim 1, wherein the identifying the information indicative of the peak magnitude includes identifying a discrete-time sample, amongst the discrete-time samples in the window, having a maximum magnitude squared value.

7. The method of claim 6, wherein establishing the value for a discrete-time sample of the envelope tracking signal using the information indicative of the peak magnitude includes determining a magnitude of the sample having the maximum magnitude squared value.

8. The method of claim 1, wherein the filtering the envelope tracking signal uses a discrete-time low-pass filter.

9. The method of claim 1, wherein modulating the signal provided to the power supply node includes using an envelope tracking driver circuit; and
wherein the filtering is provided by a frequency response of the envelope tracking driver circuit.

10. An electronic circuit for providing power amplifier supply modulation, comprising:
a tapped first delay line configured to store discrete-time samples corresponding to a signal to be amplified, after a specified delay, by a power amplifier circuit, the discrete-time samples defining a first bandwidth; and
a bandwidth-compressing envelope tracking circuit configured to:
receive the discrete-time samples from the tapped first delay line;
identify information representative of a peak magnitude within a specified temporal window defining a sequence of the discrete-time samples, the temporal window defined by the specified delay established by the tapped first delay line;
establish a value for a discrete-time sample of an envelope tracking signal using the information indicative of the peak magnitude; and
filter the envelope tracking signal to provide a bandwidth-compressed envelope tracking signal defining a second bandwidth that is narrower than the first bandwidth, the bandwidth-compressed envelope tracking signal provided at an output of the bandwidth-compressing envelope tracking circuit for use by an envelope tracking driver circuit configured to modulate a signal provided to a power supply node of the power amplifier, the bandwidth-compressed envelope tracking signal temporally aligned with the signal to be amplified by the power amplifier circuit;
wherein identifying the information indicative of the peak magnitude includes determining a magnitude squared value.

11. The electronic circuit of claim 10, further comprising the envelope tracking driver circuit, wherein the envelope tracking driver circuit is configured to modulate the signal provided to the power supply node of the power amplifier using an analog representation of the bandwidth-compressed envelope tracking signal.

12. The electronic circuit of claim 10, wherein the discrete-time samples each include an in-phase component and a quadrature component; and
wherein the bandwidth-compressing envelope tracking circuit is configured to identify the information indicative of the peak magnitude including determining the magnitude squared value comprising a value of the in-phase component squared plus a value of the quadrature component squared and
identifying a discrete-time sample in the window having a maximum magnitude squared value.

13. The electronic circuit of claim 12, wherein the bandwidth-compressing envelope tracking circuit includes a magnitude detector circuit that is configured to establish the value for the discrete-time sample of the envelope tracking signal using the information indicative of the peak magnitude including determining a magnitude of the sample having the maximum magnitude squared value without requiring use of an arithmetic multiplier circuit.

14. The electronic circuit of claim 10, comprising a second delay line in a signal path coupled to an input of the power amplifier, the second delay line configured to temporally align the signal to be amplified by the power amplifier with the bandwidth-compressed envelope tracking signal.

15. The electronic circuit of claim 10, wherein the bandwidth-compressing envelope tracking circuit comprises a low-pass filter configured to filter the envelope tracking signal to provide the bandwidth-compressed envelope tracking signal.

16. The electronic circuit of claim 10, further comprising the power amplifier.

17. An electronic circuit for providing power amplifier supply modulation, comprising:
a tapped first delay line configured to store discrete-time samples corresponding to a signal to be amplified, after a specified delay, by a power amplifier circuit, the discrete-time samples defining a first bandwidth;
an envelope tracking circuit configured to:
receive the discrete-time samples from the tapped first delay line;
identify information representative of a peak magnitude within a specified temporal window defining a sequence of the discrete-time samples, the temporal window defined by a specified delay established by the tapped first delay line;
establish a value for a discrete-time sample of an envelope tracking signal using the information indicative of the peak magnitude; and
an envelope tracking driver circuit configured modulate a signal provided to a power supply node of the power amplifier using an analog representation of a bandwidth-compressed envelope tracking signal, the analog representation obtained at least in part by filtering the envelope tracking signal to provide the band-width-compressed envelope tracking signal, the bandwidth-compressed envelope tracking signal temporally aligned with the signal to be amplified by the power amplifier circuit to avoid saturation of the power amplifier;
wherein the filtering is provided at least in part by a frequency response of the envelope tracking driver circuit; and
wherein identifying the information indicative of the peak magnitude includes determining a magnitude squared value.

18. The electronic circuit of claim 17, wherein the frequency response is established by an amplifier circuit comprising the envelope tracking driver circuit.

19. The electronic circuit of claim 17, wherein the frequency response is established by an analog low-pass filter included as a portion of the envelope tracking driver circuit.

20. The electronic circuit of claim 17, wherein the filtering is also provided at least in part using a discrete-time filter circuit.

21. The method of claim 1, wherein identifying the information representative of the peak magnitude within the specified temporal window includes determining magnitude squared values for the discrete-time samples in the specified temporal window without determining a magnitude value for each of the discrete-time samples.

22. The electronic circuit of claim 10, wherein the envelope tracking circuit is configured to identify the information representative of the peak magnitude within the specified temporal window including determining magnitude squared values for the discrete-time samples in the specified temporal window without determining a magnitude value for each of the discrete-time samples.

23. The electronic circuit of claim 17, wherein the envelope tracking circuit is configured to identify the information representative of the peak magnitude within the specified temporal window including determining magnitude squared values for the discrete-time samples in the specified temporal window without determining a magnitude value for each of the discrete-time samples.

24. An electronic circuit for modulating an operating point of a power amplifier to enhance power consumption efficiency by using an envelope tracking signal corresponding to an input signal to be amplified, the electronic circuit comprising:
   an envelope tracking circuit configured to:
   receive discrete-time samples of the input signal to be amplified;
   identify information representative of a peak magnitude of the input signal within a specified temporal window including determining a magnitude squared value; and
   establish a value for a discrete-time sample of the envelope tracking signal using the information indicative of the peak magnitude; and
   an envelope tracking driver circuit configured to drive a node of the power amplifier using an analog representation of the envelope tracking signal, the analog representation obtained at least in part by filtering the envelope tracking signal to provide a bandwidth compressed envelope tracking signal.

25. The electronic circuit of claim 24, comprising a tapped first delay line configured to store discrete-time samples corresponding to the input signal to be amplified, after a specified delay, by the power amplifier.

26. The electronic circuit of claim 25, comprising a second delay line in a signal path coupled to an input of the power amplifier, the second delay line configured to temporally align the signal to be amplified by the power amplifier with the bandwidth-compressed envelope tracking signal.

27. The electronic circuit of claim 24, wherein the envelope tracking circuit is configured to identify the information representative of the peak magnitude within the specified temporal window including determining respective magnitude squared values for the discrete-time samples in the specified temporal window without determining a magnitude value for each of the discrete-time samples.

28. A method for modulating an operating point of a power amplifier to enhance power consumption efficiency by using an envelope tracking signal corresponding to an input signal to be amplified, the method comprising:
   receiving discrete-time samples corresponding to the input signal to be amplified;
   identifying information representative of a peak magnitude of the input signal within a specified temporal window defining a sequence of the discrete-time samples including determining a magnitude squared value;
   establishing a value for a sample of an envelope tracking signal using the information indicative of the peak magnitude; and
   modulating a node of the power amplifier using an analog representation of the envelope tracking signal, the analog representation obtained at least in part by filtering the envelope tracking signal to provide a bandwidth-compressed envelope tracking signal.

29. The method of claim 28, wherein receiving the discrete-time samples corresponding to the input signal to be amplified includes storing the discrete-time samples in a tapped first delay line providing a specified delay defining the window.

30. The method of claim 29, comprising temporally aligning the input signal to be amplified by the power amplifier with the bandwidth-compressed envelope tracking signal using a second delay line.

31. The method of claim 28, wherein the identifying the information indicative of the peak magnitude includes identifying a discrete-time sample among of the discrete-time samples in the window having a maximum magnitude squared value.

32. The method of claim 31, wherein establishing the value for a discrete- time sample of the envelope tracking signal using the information indicative of the peak magnitude includes determining a magnitude of the identified discrete-time sample having the maximum magnitude squared value.

33. The method of claim 28, wherein identifying the information representative of the peak magnitude within the specified temporal window includes determining respective magnitude squared values for the discrete-time samples in the specified temporal window without determining a magnitude value for each of the discrete-time samples.

* * * * *